(12) United States Patent
Ajit

(10) Patent No.: US 6,914,466 B2
(45) Date of Patent: *Jul. 5, 2005

(54) INPUT CIRCUIT WITH HYSTERESIS

(75) Inventor: Janardhanan S. Ajit, Irvine, CA (US)

(73) Assignee: Broadcom Corporation, Irvine, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 10/845,352

(22) Filed: May 14, 2004

(65) Prior Publication Data

US 2004/0207438 A1 Oct. 21, 2004

Related U.S. Application Data

(63) Continuation of application No. 10/255,577, filed on Sep. 27, 2002, now Pat. No. 6,741,112.
(60) Provisional application No. 60/360,174, filed on Mar. 1, 2002.

(51) Int. Cl.$^7$ .................................................. H03K 3/037
(52) U.S. Cl. ........................................ 327/205; 327/206
(58) Field of Search ............................... 327/72–74, 77, 327/205, 206, 52, 55, 57, 65

(56) References Cited

U.S. PATENT DOCUMENTS

| | | | |
|---|---|---|---|
| 4,097,772 A * | 6/1978 | Carter ........................ | 327/206 |
| 4,256,974 A | 3/1981 | Padgett et al. .............. | 307/475 |
| 4,719,367 A | 1/1988 | Denda ........................ | 327/206 |
| 4,733,107 A | 3/1988 | O'Shaughnessy et al. .. | 327/206 |
| 5,087,841 A | 2/1992 | Rogers ........................ | 326/65 |
| 5,319,265 A | 6/1994 | Lim ............................ | 327/73 |
| 5,463,339 A | 10/1995 | Riggio, Jr. .................. | 327/206 |
| 5,736,869 A | 4/1998 | Wei ............................ | 326/81 |
| 6,130,556 A | 10/2000 | Schmitt et al. ............. | 326/81 |
| 6,281,731 B1 * | 8/2001 | Fifield et al. ............... | 327/205 |
| 6,288,575 B1 * | 9/2001 | Forbes ........................ | 327/57 |
| 6,566,926 B1 * | 5/2003 | Patterson .................... | 327/206 |
| 2003/0001644 A1 | 6/2001 | Chao et al. | |

FOREIGN PATENT DOCUMENTS

EP          0 555 779 A1       8/1993

OTHER PUBLICATIONS

Sedra, A.; Smith, K: "Microelectronic Circuits" 1987, Holt, Rinehart and Winston, Inc., New York, XP002261210, pp. 240–241.
European Search Report from European Appl. No. 03004688.2, 3 pages dated Dec. 9, 2003.

* cited by examiner

*Primary Examiner*—My-Trang Nu Ton
(74) *Attorney, Agent, or Firm*—Sterne, Kessler, Goldstein & Fox P.L.L.C.

(57) ABSTRACT

An input circuit has hysteresis to mitigate the effects of input noise. The input circuit receives an analog input signal and determines whether the unregulated analog input signal is a high or a low voltage. The input circuit outputs a regulated low voltage (i.e., "0") for a low input signal, and outputs a regulated high voltage (i.e., "1") for a high input signal. The low-to-high transition occurs at a higher voltage than a high-to-low transition, which mitigates noise on the input signal. Furthermore, the comparator includes a feedback path from an output of the comparator to an input of the comparator. The feedback path causes some delay in any output voltage transition (i.e. high-to-low output transition or low-to-high transition), which further enhances the hysteresis effect and improves noise immunity. An embodiment of the circuit interfaces with high voltage (e.g., 5V) input signals and outputs low voltage (e.g., 1.2V) output signals. In other words, the input circuit also provides a voltage transition while detecting the low-to-high and high-to-low transitions.

20 Claims, 5 Drawing Sheets

INPUT CIRCUIT WITH HYSTERESIS

CROSS-REFERENCE TO RELATED APPLICATIONS

This application is a continuation of U.S. patent application Ser. No. 10/255,577, filed Sep. 27, 2002, now U.S. Pat. No. 6,741,112 which claims the benefit of U.S. Provisional Application No. 60/360,174, filed on Mar. 1, 2002, both of which are incorporated herein by reference in their entirety.

BACKGROUND OF THE INVENTION

1. Field of the Invention

The present invention is related to input circuits, and more specifically to input circuits having hysteresis.

2. Background Art

There is a desire to design an input circuit with hysteresis to mitigate the effects of noise from an unregulated input signal received at the input (pad). It is advantageous for the input circuit to have tight control of the input switching point.

Furthermore, integrated circuits (ICs) are being built in reduced feature size technologies and reduced core voltage levels in the range of 1.2V. These ICs may need to interface with input signals with higher voltage levels.

BRIEF SUMMARY OF THE INVENTION

The present invention includes an input circuit having hysteresis to mitigate the effects of input noise. The input circuit receives an analog input signal and determines whether the unregulated analog input signal is a high or a low voltage. The input circuit outputs a regulated low voltage (i.e., "0") for a low input signal, and outputs a regulated high voltage (i.e., "1") for a high input signal.

The input circuit includes a comparator that has a hysteresis property, where the output transition from low-to-high requires a higher input voltage than the transition from high-to-low. In other words, the comparator is configured to have two trigger voltages. In order for the output to transition from low-to-high, the input voltage must rise above a first threshold voltage. In order for the output to transition from high-to-low, the input voltage must fall below a second threshold voltage, where the first threshold voltage is higher than the second threshold voltage. The two separate thresholds help prevent noise on the input signal from inadvertently causing the input circuit to change state. Furthermore, the comparator includes a feedback path from an output of the comparator to an input of the comparator. The feedback path causes some delay in any output voltage transition (i.e. high-to-low output transition or low-to-high transition), which further enhances the hysteresis effect and improves noise immunity.

An embodiment of the circuit interfaces with high voltage (e.g., 5V) input signals and outputs low voltage (e.g., 1.2V) output signals. In other words, the input circuit also provides a voltage transition while detecting the low-to-high and high-to-low transitions.

BRIEF DESCRIPTION OF THE DRAWINGS/FIGURES

The present invention is described with reference to the accompanying drawings. In the drawings, like reference numbers indicate identical or functionally similar elements. Additionally, the left-most digit(s) of a reference number identifies the drawing in which the reference number first appears.

DETAILED DESCRIPTION OF THE INVENTION

Figure 1:
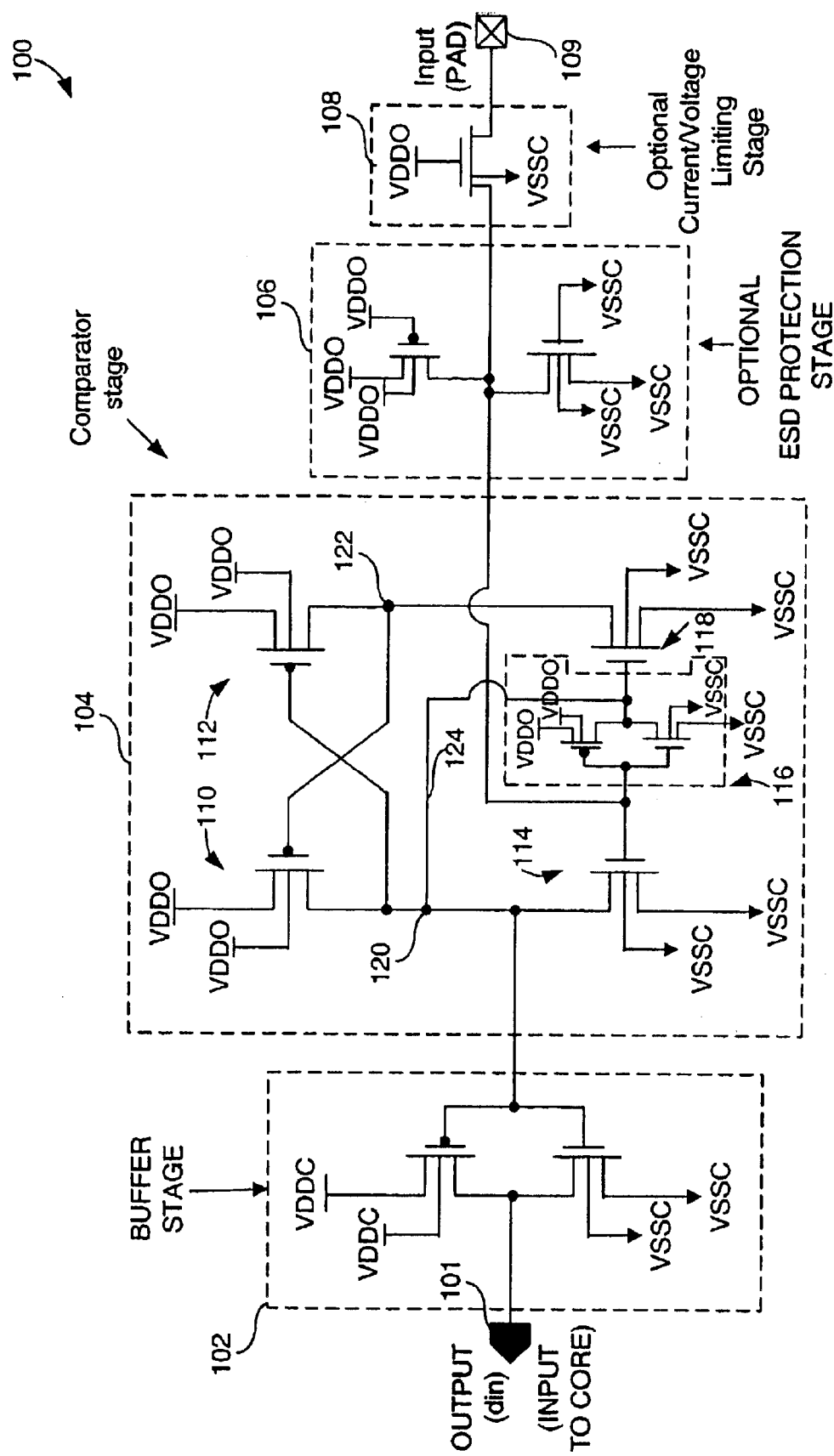
FIG. 1 illustrates an input circuit having a comparator with hysteresis according to embodiments of the present invention.

FIG. 1 illustrates an input circuit 100 according to one embodiment of the present invention. Input circuit 100 receives an unregulated input signal at the input pad 109, and determines whether the unregulated input signal is a high or low voltage based on the amplitude. The input circuit 100 outputs a regulated high voltage at the output 101 when the unregulated input voltage is higher than a first threshold voltage (e.g., pre-determined value), and outputs a regulated low voltage at the output pad 101 when the unregulated input voltage is lower than a second threshold voltage (e.g., pre-determined value). The input circuit 100 has a hysteresis property where the output transition from low-to-high requires a higher input voltage than the transition from high-to-low. In other words, there are two trigger voltages. In order for the output to transition from low-to-high, the input voltage at pad 109 must rise above a first threshold voltage. In order for the output to transition from high-to-low, the input must fall below a second threshold voltage, where the first threshold voltage is higher than the second threshold voltage. The two separate thresholds help increase noise tolerance on the input signal and reduces the likelihood that noise will inadvertently cause the input circuit 100 to change state.

The input circuit 100 includes an optional current/voltage limiting stage 108, an optional Electro-Static Discharge (ESD) protection stage 106, a comparator 104, and an output buffer/inverter 102. The current/voltage limiting stage 108 and ESD protection stage 106 provide current and voltage protection for the comparator 104 as will be understood by those skilled in the art. The comparator 104 detects voltage transitions (high-to-low and low-to-high) in an input signal received at the pad 109, and generates a voltage output at node 120 that is representative of the input voltage (and any voltage transitions) at the input pad 109. The buffer/inverter 102 inverts the output of comparator 104 and delivers a regulated output voltage to the output pad 101, where the amplitude of the regulated output voltage is determined by the supply voltages VSSC and VDDC. As such, the voltage supply VDDC can be increased or reduced relative to the supply voltage VDDO. For example, if the circuit connected to the output pad 101 is low voltage circuit, then the voltage supply VDDC can be set to a lower supply voltage (e.g., 1.2 V) for compatibility. Whereas, the voltage supply VDDO can be maintained at a higher supply voltage (e.g., 3.3 V) to accommodate higher voltage input signals. Accordingly, the input circuit can realize a voltage level shift from higher voltage input signal to a lower voltage output signal (e.g., 5.0 V to 1.2 V).

The comparator 104 includes an N-type field effect transistor (NFET) 114 and a NFET 118, having their respective gates connected together through an inverter 116. The gate of NFET 114 directly receives the input signal from input pad 109, and the gate of NFET 118 receives an inverted version of the input signal from the inverter 116. The sources of the NFETs 114 and 118 are connected to VSSC, which is a relative low supply voltage. For example, VSSC could be ground or even a negative voltage in embodiments of the invention. The drains of NFETs 114 and 118 are connected to respective P-type field effect transistors (PFETs) 110 and 112 at respective nodes 120 and 122. More specifically, the drain of NFET 114 is connected to the drain of PFET 110 at node 120, and the drain of NFET 118 is connected to the drain of PFET 112 at node 122. The sources of the PFETs 110 and 112 are connected to a relative high supply voltage VDDO (e.g., 3.3 volts).

The comparator 104 includes a feedback path from the output to the input. More specifically, the output node 120 is fed back to the gate of NFET 118 by the feedback path 124. As will be discussed further herein, this feedback path 124 causes a delay in the state change of the comparator 104, thereby providing the desired hysteresis effect and improved noise immunity.

In embodiments of the invention, the NFETs and PFETs are MOSFETs that are produced using standard CMOS processes. Other processes and transistor structures could be used as will be understood by those skilled in the arts, based on the discussion given herein.

Figure 2:
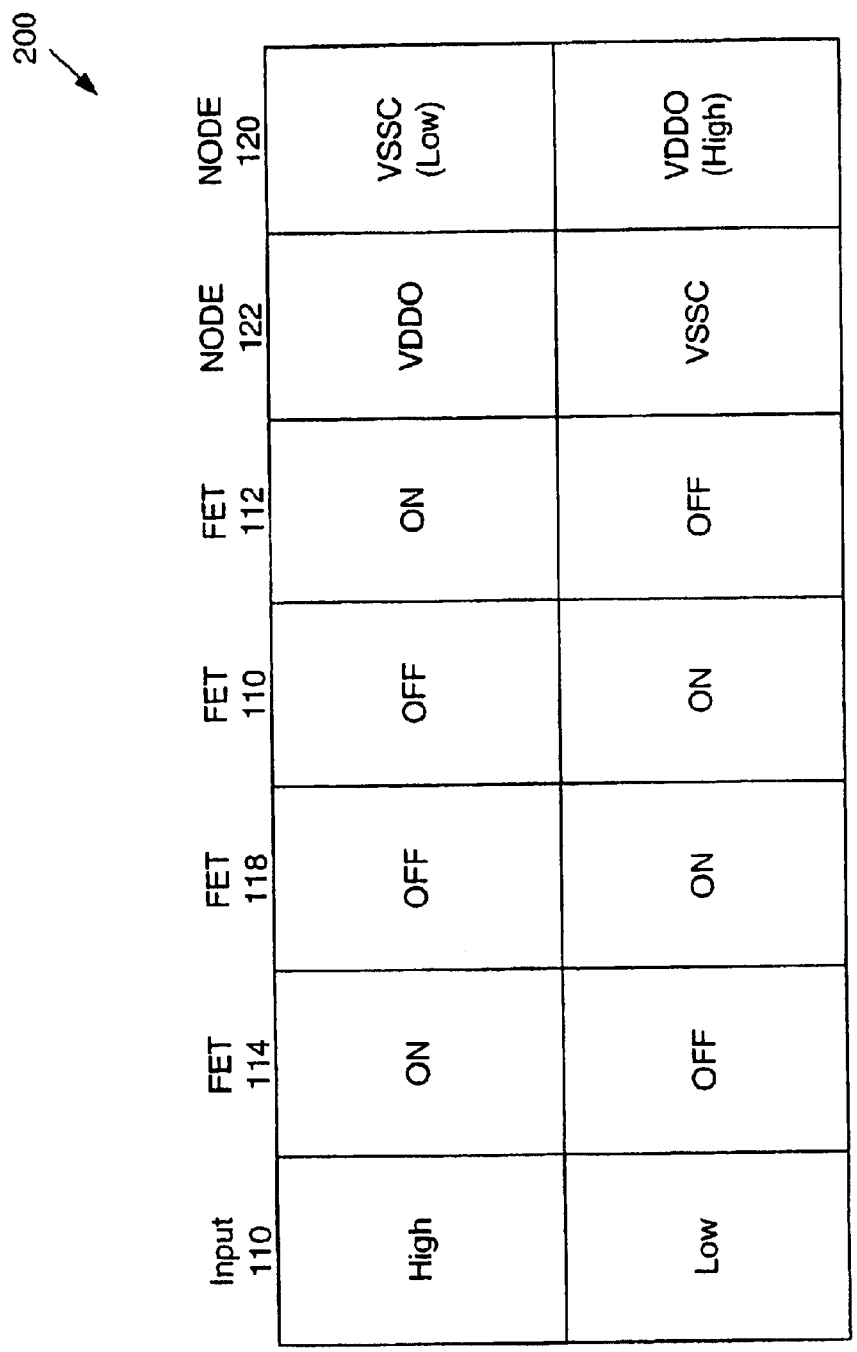
FIG. 2 illustrates a table 200 that describes the operation of the comparator in FIG. 1.

FIG. 2 illustrates a table 200 that further describes the operation of the comparator 104. More specifically, the table 200 describes the steady state of the comparator elements for both a high input and a low input at the pad 109. The table 200 is discussed for high and low input voltages below.

For a high input voltage at steady state, the NFET 114 is turned ON because the high input voltage is applied to the gate of the NFET 114. When NFET 114 conducts, the node 120 is pulled down to VSSC. Inverter 116 inverts the high input voltage and applies the resulting low voltage to the gate of NFET 118, thereby cutting OFF NFET 118. The VSSC voltage at node 120 is applied to the gate of PFET 112 and turns ON the PFET 112, which pulls up node 122 to VDDO. The VDDO voltage at the node 122 is applied to the gate of PFET 110 so as to turn OFF the PFET 110. As a result, the output node 120 of the comparator 104 outputs a low voltage VSSC for a high input voltage at the pad 109. The low voltage VSSC is inverted by the buffer/inverter 112 to output a regulated high voltage VDDC at the output 101.

For a low input voltage, the NFET 114 is cutoff because the low input voltage is applied to its gate. Inverter 116 inverts the low input voltage and applies the resulting high voltage to the gate of NFET 118, thereby turning ON the NFET 118. The conducting NFET 118 causes the node 122 to be pulled down to VSSC. The VSSC voltage at the node 122 is applied to the gate of the PFET 110, causing the PFET 110 to conduct which raises the voltage at node 120 to VDDO. The VDDO voltage at node 120 is applied to the gate of PFET 112 so as to turn OFF the PFET 112. As a result, the output node 120 of the comparator 104 outputs a high voltage VDDO for a low input voltage. The high voltage VDDO is inverted by the buffer/inverter 102 to output a regulated low voltage VSSC at the output 101.

The desired hysteresis effect is realized by the feedback path 124 from the output node 120 to the gate of the NFET 118. This can be seen by examining the operation of the comparator 104 during a transition from a voltage low input to a voltage high input (i.e., low-to-high transition) and vice versa (i.e., high-to-low transition).

As discussed above, the comparator stage 104 consists of NFET 114 and NFET 118. Depending on the level of the signal at the input (pad) 109 and the nature of the signal (rising/falling), the output of the comparator 104 will be high or low. For rising inputs, the switching point (or threshold) of the comparator 104 (Vsw,r) is greater than the switching point (or threshold) of the comparator 104 (Vsw,f) for falling inputs. The difference between Vsw,r and Vsw,f is the hysteresis of the comparator 104. The switching point of the comparator 104 can be changed mainly by changing the ratio of NFET 114 to NFET 118. In other words, the switching point of the comparator 104 can be adjusted by changing the relative size of NFET 114 to NFET 118, which changes their respective threshold voltages.

Prior to a low-to-high transition, node 120 is at a voltage high (see Table 200), which is also applied to the gate of NFET 118 by the feedback path 124. Once the high input voltage arrives from input pad 109, the inverter 116 applies a low voltage to the gate of the NFET 118. However, the new low voltage (temporarily) conflicts with the high voltage from the node 120 that is already sitting at the gate of the NFET 118. Therefore, the NFET 118 (and the comparator 104) does not instantaneously change state. Instead, there is some delay until the effect of the new input can work its way through the comparator 104. As a result, if the new high input voltage is noise that quickly returns low again, the comparator 104 will not change state. In other words, if the new input voltage is noise, the feedback voltage from the output node 120 will remain dominant and the comparator 104 will not change state.

Prior to a high-to-low transition, node 120 is at a low voltage (see Table 200), which is applied to the gate of FET 118 by the feedback path 124. Once the low voltage arrives from input pad 109, the inverter 116 applies a HIGH voltage to the gate of the NFET 118. The new high voltage (temporarily) conflicts with the low voltage from the node 120 that is already sitting at the gate of NFET 118. Therefore, the NFET 118 (and the comparator 104) does not instantaneously change state. Instead, there is some delay until the effect of the new input can work its way through the comparator 104. As a result, if the new low voltage is noise that quickly goes high gain, the comparator 104 will not change state.

The overall result is the voltage threshold for a low-to-high transition is higher than the voltage threshold for a high-to-low transition. These different thresholds mitigate the effects of input noise as discussed above.

Figure 3:
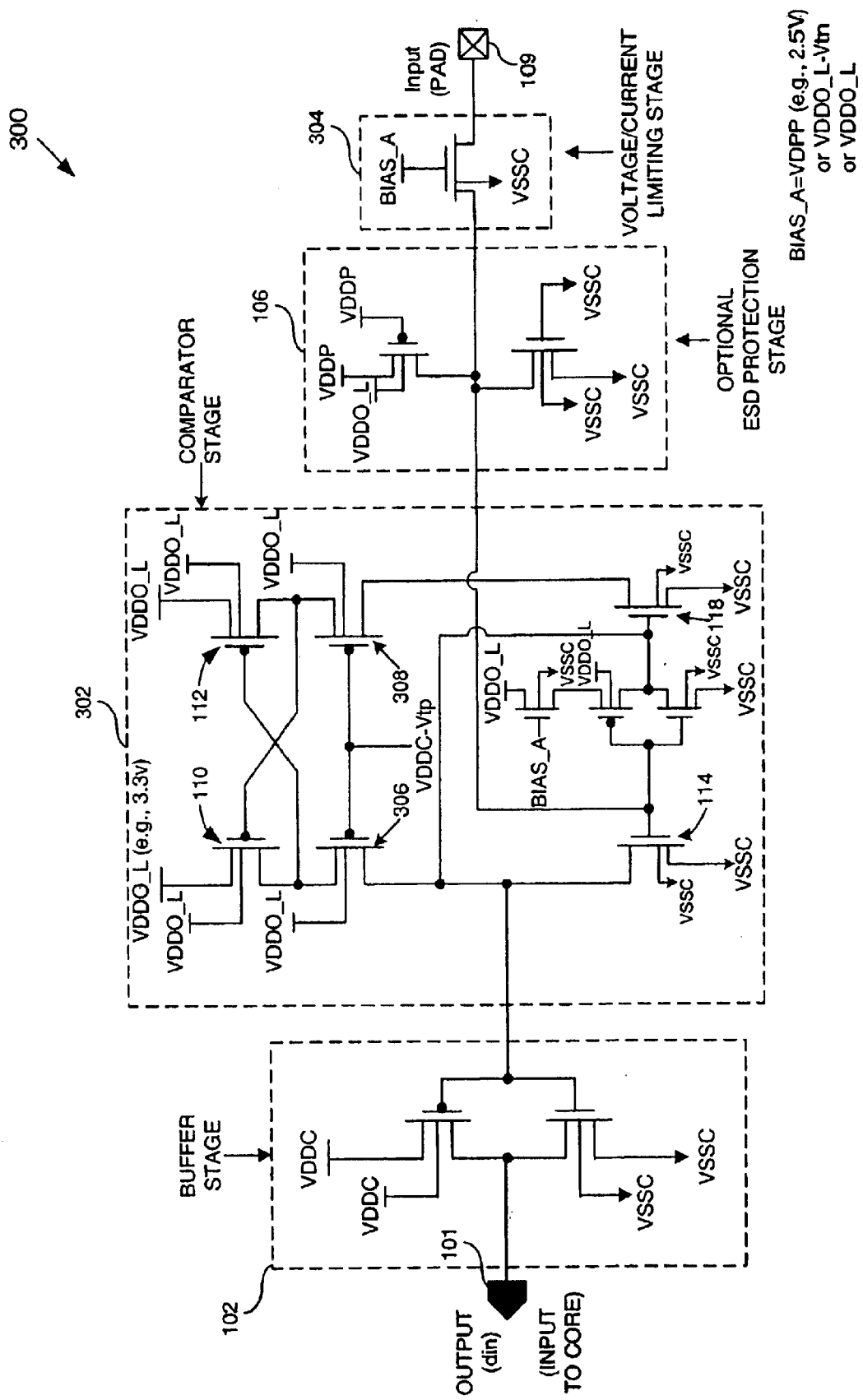
FIG. 3 illustrates an input circuit having hysteresis and also having voltage limiting/protection according to embodiments of the present invention.

FIG. 3 illustrates an embodiment 300 of the invention for interfacing with high voltage (e.g., 5V) input signals and having low-voltage (e.g., 1.2V) signals at the output. The input signals received at the pad 109 go through a NFET 304. The gate of the NFET 304 is tied to VDDP (e.g., 2.5V) and hence the maximum voltage at the output of the NFET 304 is VDDP-Vtn (i.e., VDDP-threshold voltage for NFET). For example if the gate of NFET 304 is tied to 2.5V, then the NFET 304 will convert a 5V swing at the input pad 109 to a 2V swing seen by the comparator 302. Alternately, the gate of NFET 304 may be tied to VDDO_L (e.g., 3.3V) or VDDO_L-Vtn in which cases the maximum voltage at the output of the NFET is VDDO_L-Vtn or VDDO_L-Vtn-Vtn, respectively. The output of the NFET 304 goes through a comparator stage 302 to determine if the input is a high or a low, as described above.

As discussed above, the comparator stage 302 consists of NFET 114 and NFET 118. Depending on the level of the signal at the input (pad) 109 and the nature of the signal (rising/falling), the output of the comparator 302 will be high or low. For rising inputs, the switching point (or threshold) of the comparator 302 (Vsw,r) is greater than the switching point (or threshold) of the comparator 302 (Vsw,f) for falling inputs. The difference between Vsw,r and Vsw,f is the hysteresis of the comparator 302. The switching point of the comparator 302 can be changed mainly by changing the ratio of NFET 114 to NFET 118.

The additional PFETs 306 and 308 provide a voltage drop for the respective PFETs 110 and 112 to protect the gates of these PFETs. The PFETs 306 and 308 are biased to VDDC-Vtp (i.e., VDDC-threshold voltage for PFET) which is approximately 1V. The gate voltages of PFETs 110 and 112 are therefore limited to approximately 2.5V.

Figure 4:
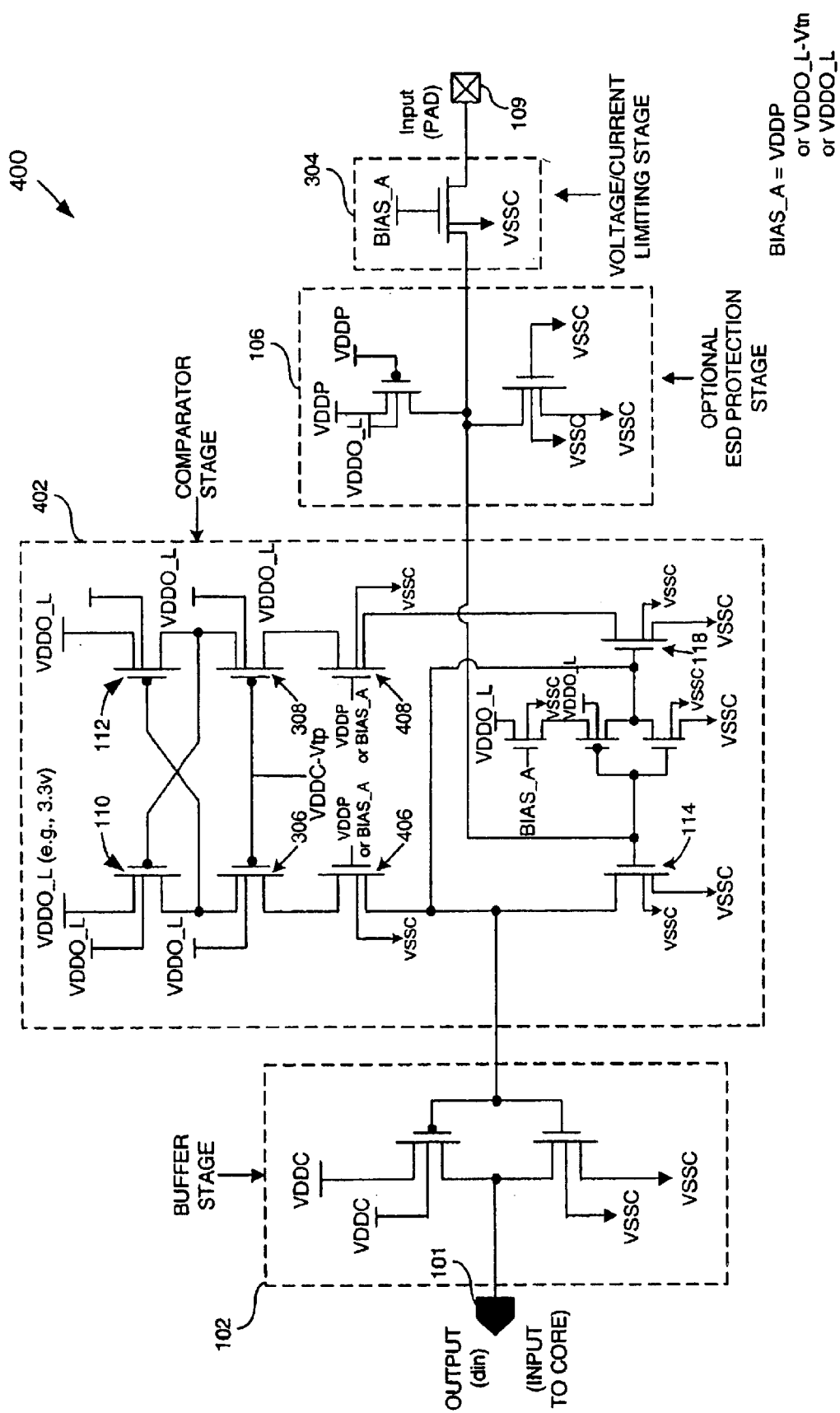
FIG. 4 illustrates an input circuit having hysteresis and also having voltage limiting/protection according to another embodiment of the present invention.

FIG. 4 illustrates an embodiment of the invention with an additional voltage protection feature. The NFETs 406 and 408 in comparator 402 provide voltage limiting protection for the gates of NFETs 114 and 118.

Figure 5:
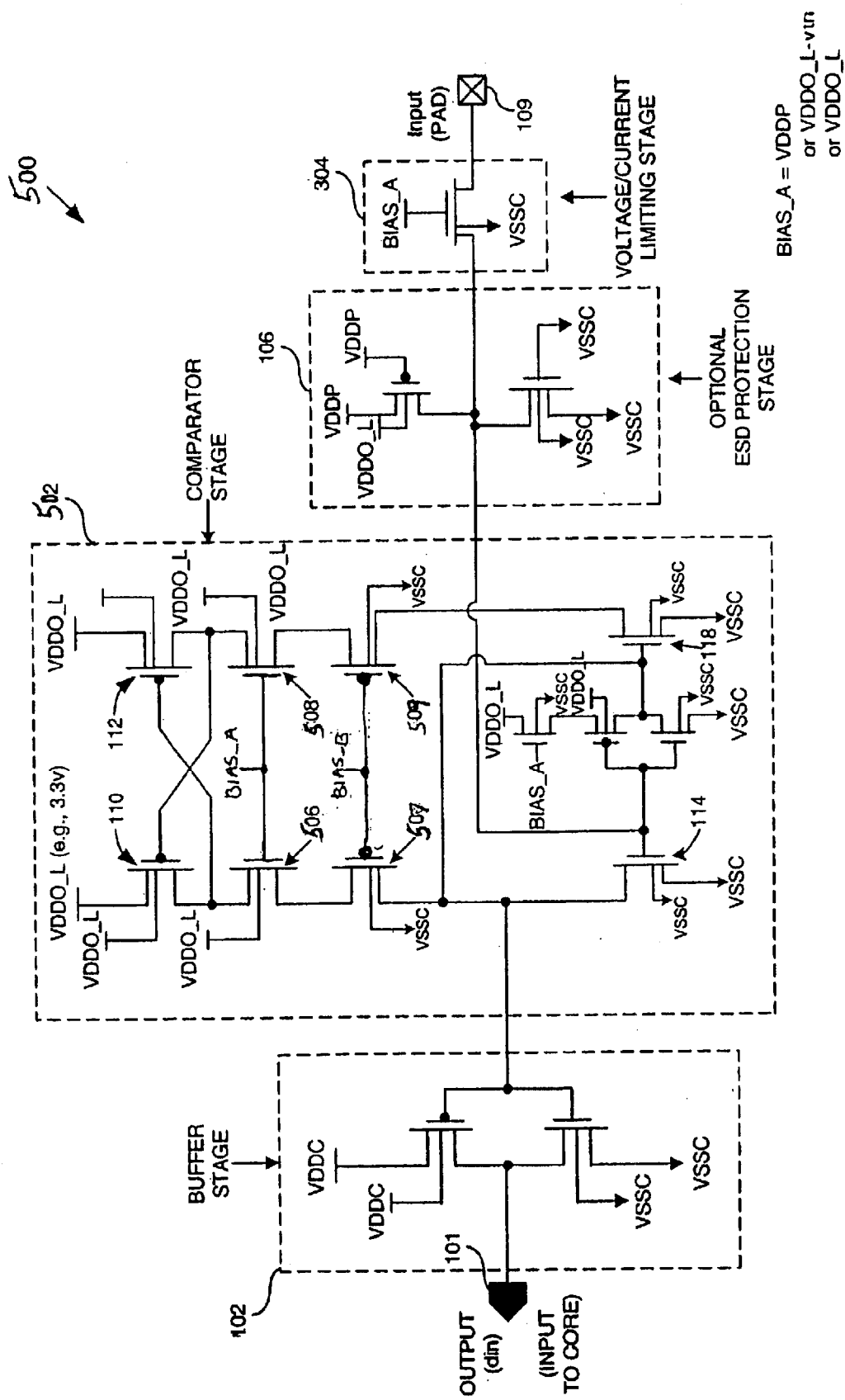
FIG. 5 illustrates an input circuit having hysteresis and also having voltage limiting/protection according to another embodiment of the present invention.

FIG. 5 illustrates an input circuit 500 that is a variation of the embodiment of FIG. 4, where the voltage protection NFETs and PFETs are inter-changed relative to the circuit in FIG. 4. The NFETs 506 and 508 have their respective gates tied to BIAS_A and the PFETs 507 and 509 have their gates tied to BIAS_B. BIAS_A, as an example, could be VDDO_L, VDDO_L-Vtn, or VDDP. BIAS_B, as an example, could be 0, VDDC-Vtp, or VDDC. The NFETs 506 and 508 limit the maximum voltage at their respective sources to BIAS_A-Vtn and the PFETs 507 and 509 limit the minimum voltage at their respective sources to BIAS_B+Vtp.

Conclusion

Example embodiments of the methods, systems, and components of the present invention have been described herein. As noted elsewhere, these example embodiments have been described for illustrative purposes only, and are not limiting. Other embodiments are possible and are covered by the invention. Such other embodiments will be apparent to persons skilled in the relevant art(s) based on the teachings contained herein. Thus, the breadth and scope of the present invention should not be limited by any of the above-described exemplary embodiments, but should be defined only in accordance with the following claims and their equivalents.

What is claimed is:

1. A comparator with hysteresis, comprising:
   an input node to receive an input voltage;
   first and second transistors configured to provide a first output voltage transition in response to the input voltage exceeding a first threshold voltage and to provide a second output voltage transition in response to the input voltage going below a second threshold voltage, wherein the first threshold voltage is greater than the second threshold voltage; and
   an inverter coupled between a gate of the first transistor and a gate of the second transistor, wherein the gate of the first transistor is coupled to the input node; and
   a feedback coupled between the gate of the second transistor and an output node to delay the first or second output voltage transition at the output node.

2. The comparator of claim 1, wherein the first and second transistors are MOSFET transistors.

3. The comparator of claim 1, wherein the first output voltage transition includes a transition from a low output voltage to a high output voltage, and the second output voltage transition includes a transition from a high output voltage to a low output voltage.

4. The comparator of claim 1, wherein the first transistor is scaled in size relative to the second transistor.

5. The comparator of claim 1, wherein the first transistor has the first threshold voltage.

6. The comparator of claim 1, further comprising at least one protection transistor to limit a bias voltage received by at least one of the first and second transistors.

7. The comparator of claim 1, wherein a buffer stage is coupled to the output node.

8. The comparator of claim 1, further comprising at least one protection transistor coupled between the input node and the first and second transistors to limit a voltage or a current received at the gates of the first and second transistors.

9. The comparator of claim 1, further comprising an electrostatic discharge protection stage coupled between the input node and the first and second transistors.

10. The comparator of claim 1, wherein the input voltage temporarily conflicts with a voltage at the output node in response to a voltage transition of the input voltage, thereby facilitating delay of the first or second output voltage transition.

11. The comparator of claim 1, wherein in response to an input voltage transition from a low input voltage to a high input voltage at the input node the first transistor is activated to connect a supply voltage to the output node and the second transistor is de-activated by an output of the inverter, and wherein the supply voltage temporarily conflicts with a pre-existing voltage at the gate of the second transistor due to the feedback.

12. The comparator of claim 1, wherein in response to an input voltage transition from a high input voltage to a low input voltage at the input node the first transistor is de activated and the second transistor is activated by an output of the inverter to connect a supply voltage to the output node, and wherein the supply voltage temporarily conflicts with a pre-existing voltage at the gate of the second transistor due to the feedback.

13. An apparatus, comprising:
   a first switching means for connecting an output node to a first supply voltage based on a first state of an input signal;
   a second switching means for connecting the output node to a second supply voltage based on a second state of the input signal;
   inverting means coupled between the first switching means and the second switching means, wherein an output of the inverting means is coupled to the output node, and wherein the first or second supply voltage at the output node temporarily conflicts with a pre-existing voltage at the output of the inverting means.

14. The apparatus of claim 13, wherein the first switching means includes a first MOSFET transistor and the second switching means includes a second MOSFET transistor.

15. The apparatus of claim 13, wherein the first switching means is scaled in size relative to the second switching means.

16. The apparatus of claim 13, further comprising protection means to limit a bias voltage received by at least one of the first and second switching means.

17. The apparatus of claim 13, wherein a buffer stage is coupled to the output node.

18. The apparatus of claim 13, further comprising protection means coupled to an input of the first and second switching means to limit a voltage or a current received at the input of the first and second switching means.

19. The apparatus of claim 13, further comprising an electrostatic discharge protection stage coupled to an input of the first and second switching means.

20. The apparatus of claim 13, wherein the first or second supply voltage at the output node temporarily conflicts with the pre-existing voltage at the output of the inverter in response to a change of state of the input signal.

* * * * *